United States Patent [19]

Slawson et al.

[11] 3,816,760

[45] June 11, 1974

[54] VARIABLE LEVEL NOISE BARRIER CIRCUIT RESPONSIVE TO A BIPOLAR INPUT AND HAVING VARIABLE BIPOLAR HYSTERESIS AND HAVING A BIPOLAR OUTPUT

[75] Inventors: Richard S. Slawson, Barrington, R.I.; Alfred Nazareth, Jr., Rehoboth, Mass.

[73] Assignee: G. W. Dahl Co., Inc., Bristol, R.I.

[22] Filed: Oct. 26, 1971

[21] Appl. No.: 192,137

[52] U.S. Cl. ........... 307/235 R, 307/290, 330/30 D, 330/69, 330/104

[51] Int. Cl. ............................................ H03k 5/20

[58] Field of Search ........... 330/30 D, 69, 104, 146; 307/235 R, 289, 290

[56] References Cited

UNITED STATES PATENTS

| | | | |
|---|---|---|---|
| 2,923,840 | 2/1960 | Ellsworth | 307/290 X |
| 3,430,152 | 2/1969 | Walsh | 330/69 UX |
| 3,477,034 | 1/1969 | Gioia et al. | 330/69 |
| 3,489,955 | 1/1970 | Freeborn | 330/104 X |
| 3,638,133 | 1/1972 | Meyers | 330/104 |

OTHER PUBLICATIONS

Clayton, "Operational Amplifiers," Wireless World, April 1969, pp. 154–156.

Applications Manual For Operational Amplifiers, Philbrick/Nexus Research, Copyright 1968, p. 58.

*Primary Examiner*—Herman Karl Saalbach
*Assistant Examiner*—James B. Mullins
*Attorney, Agent, or Firm*—David E. Hoppe

[57] ABSTRACT

A noise barrier circuit employs an amplifier in a bridge circuit having positive and negative feedback paths in two of the bridge legs. When the bridge is balanced, the feedback paths mutually cancel, and the circuit operates as an open-loop amplifier. When the bridge is unbalanced, a hysteresis effect is produced by the difference in feedback effects, and unwanted signals within the bipolar hysteresis levels are not passed to the output of the noise barrier circuit. The hysteresis effect is adjustable to desired levels by the degree of bridge imbalance. A modification permits unbalancing the bridge functionally by varying the amount of feedback in one of the feedback paths rather than varying a bridge leg resistance, thereby providing for improved d-c stability. The noise barrier circuits operate upon bipolar inputs and produce a bipolar output.

6 Claims, 3 Drawing Figures

PATENTED JUN 11 1974 3,816,760

INVENTOR.
RICHARD S. SLAWSON
ALFRED NAZARETH, Jr.
BY
David E. Hoppe
ATTORNEY

VARIABLE LEVEL NOISE BARRIER CIRCUIT RESPONSIVE TO A BIPOLAR INPUT AND HAVING VARIABLE BIPOLAR HYSTERESIS AND HAVING A BIPOLAR OUTPUT

There are a number of existing electronic circuits having the function of distinguishing between noise and signal at the input thereof so as to transfer to the output thereof a translated noise-free signal. Of the many approaches to this useful function, those that employ a hysteresis effect are favored for precision applications such as input signal processing circuits in digital counters, where the signal must be completely separated from the influence of noise. The present invention improves upon the prior art in providing for a noise barrier that employs a variable hysteresis function and has the capacity of processing a bipolar input to yield a bistable output. In addition, the invention provides for a bipolar hysteresis effect around the zero level reference. Embodiments of the present invention are simple, effective operationally, and convenient to employ in process control applications, such as a frequency-to-current converter wherein the noise barrier circuit of the invention may be useful as the input stage thereof.

These and other features of the invention may be readily apparent from the following description taken in conjunction with the drawings, in which.

Figure 1:
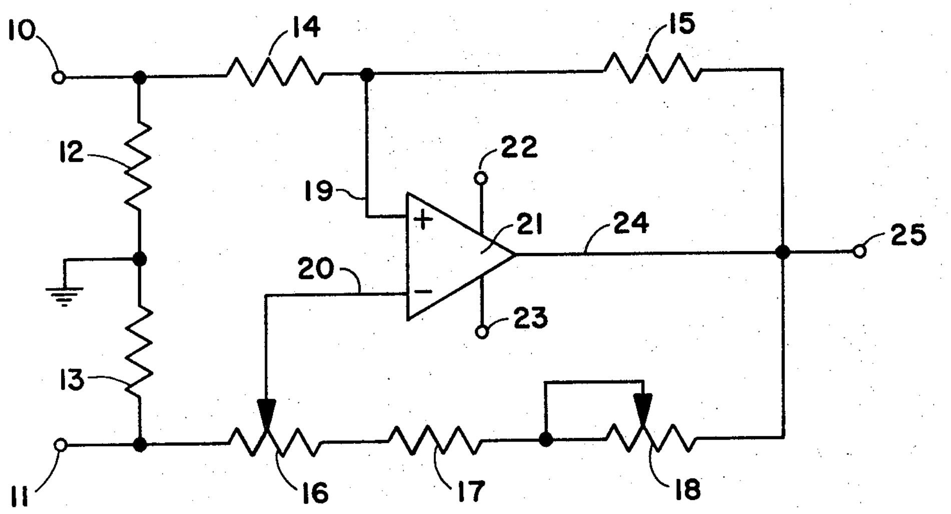
FIG. 1 is a circuit of a first embodiment of the invention.

Referring to FIG. 1, the noise barrier circuit therein depicted consists of an amplifier 21 with associated resistive components 12–18. Amplifier 21 may be readily assembled from discrete components, as may be done routinely by one skilled in the art, or more conveniently selected as an off-the-shelf integrated circuit as is readily available commercially from any of the manufacturers of integrated circuit amplifiers. Typically, any operational amplifier having a high open loop gain and with an appropriate frequency response for the selected application, may be used with the circuit of the invention. The gain must be sufficient to drive the bipolar output to saturation, and the frequency response adequate to handle the highest anticipated signal frequency.

Amplifier 21 is supplied with a positive supply voltage at terminal 22, and with a negative supply voltage at terminal 23. The voltages that are to be employed are a function of the amplifier 21 requirements, but are to be of a greater magnitude than the range of input signal levels to be processed by the noise barrier circuit. In general, the positive and negative supply voltages will define the bipolar levels appearing at output 24 of amplifier 21.

Figure 3:
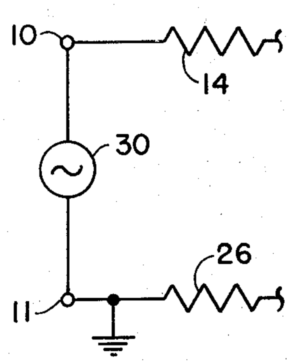
FIG. 3 shows the input circuit without input common return resistors.

The input to the noise barrier circuit of FIG. 1 is therein shown as two-wire, being furnished to input terminals 10 and 11. The two-wire form of input connection is preferable where common mode rejection is desired. Alternatively, either terminal 10 or 11 may be connected directly to the circuit common, and the other terminal 10–11 may be connected to an input source 30 referenced to circuit common, with common input reference resistances 12 and 13 omitted, as shown in FIG. 3.

In the two-wire configuration shown in FIG. 1, terminals 10 and 11 are connected to circuit common through resistances 12 and 13 respectively. Input terminal 10 is connected through resistor 14 to positive (non-inverting) differential input 19 of amplifier 21, and input terminal 11 is connected through potentiometer 16 to the negative (inverting) differential input 20 of amplifier 21.

Output 24 of amplifier 21 is connected to noise barrier output terminal 25, and a pair of feedback paths are provided from output terminal 25 to the respective differential inputs 19–20 of amplifier 21. Resistance 15 provides the positive feedback path to the differential input 19, while trimmer rheostat 18 in series with resistance 17 provides the negative feedback path through potentiometer 16 to differential input 20. The input resistances form a bridge circuit with amplifier 21, which is balanced when the ratio of resistor 15 to resistors 14 + 12 (or resistor 14 when resistor 12 is omitted) is equal to the ratio of resistors 18 + 17 to resistors 16 + 13 (or resistor 16 when resistor 13 is omitted), under the condition of the tap of potentiometer 16 being set to its junction with resistor 17. This balanced condition may be precisely obtained with the adjustment of rheostat 18, which is employed for the purpose of making the aforesaid ratios equal.

When the bridge circuit is balanced, the positive and negative feedback effects cancel out with respect to the differential inputs 19–20 of amplifier 21, and the entire noise barrier circuit in this case functions as a simple open loop amplifier with a bipolar output produced by the polarity of the input signal at terminals 10–11. In this case there is no bipolar hysteresis condition and the output is not bistable. More specifically, any voltage level appearing at output 25 is transferred equally through the positive and negative feedback paths to the positive (non-inverting) differential input 19 and the negative (inverting) differential input 20 of amplifier 21, when the bridge is balanced. Thus, the differential inputs 19–20 are at the same polarity and amplitude in the absence of an input signal. Any input signal impressed between terminals 10 and 11 will be amplified, when the bridge is balanced, in a simple open-loop manner, as though there were no feedback paths in the circuit.

The variable hysteresis effect is introduced into the noise barrier circuit by unbalancing the bridge, employing potentiometer 16. Increased bridge imbalance is obtained as the tap of potentiometer is moved from the resistor 17 side, towards the input terminal 11 side of potentiometer 16. As potentiometer 16 is adjusted away from the balanced position, by moving the tap towards terminal 11, the effects of the positive and negative feedback paths become dissimilar and any output potential appearing at terminal 25 is transferred back through the positive and negative feedback paths to introduce a voltage differential at differential inputs 19–20. If the output potential is positive, the feedback potential at differential input 20 will be less positive than the feedback potential at differential input 19. If the output potential is negative, the feedback potential at differential input 20 will be less negative than the feedback potential at differential input 19. To the extent potentiometer 16 is adjusted away from its balanced position, the feedback differential potential appearing between differential input terminals 19 and 20 increases, with the potential at terminal 20 being the lesser absolute potential as compared with the potential at terminal 19.

As an example, an output potential at terminal 25 may be impressed back through the imbalanced feedback paths to appear at terminal 20 at a potential 0.1 volts less than the potential appearing at terminal 19. If the output potential is positive, terminal 20 will be 0.1 volts less positive than terminal 19, and if the output potential is negative, terminal 20 will be 0.1 volts less negative than terminal 19. Taking the case of the output potential being positive, since terminal 19 is 0.1 volts more positive than terminal 20, amplifier 21 will maintain the output potential at the positive saturation condition until the potential between terminals 19 and 20 reverses polarity, so that terminal 20 becomes positive with respect to terminal 19. This event can occur only by the impress of an input signal between input terminals 10 and 11 resulting in terminal 10 being sufficiently negative with respect to terminal 11, (or terminal 11 being sufficiently positive with respect to terminal 10) to overcome the 0.1 volt differential appearing between terminals 19 and 20 as a consequence of the feedback action. When terminal 19 becomes more negative than terminal 20, the amplifier output will switch to its negative saturation condition. It may be readily seen that in this switched condition, terminal 20, in the absence of an input signal, is now 0.1 volts less negative than terminal 19. To reswitch the circuit again, the input signal must now overcome this bias by introducing a potential at 10 positive with respect to terminal 11, sufficient to overcome the 0.1 volt feedback differential at terminals 19–20. Thereby, in the imbalanced condition of the noise barrier circuit, the output thereof is bipolar and bistable, with a bipolar hysteresis effect which requires a crossing of the hysteresis level by an input signal of an alternate polarity for each new switching action. Reference zero crossings by the input signal are not acted upon, since the input must produce a crossing of the hysteresis level (the positive level if the barrier circuit is in negative saturation and the negative level if the barrier circuit is in positive saturation) to effect circuit switching. This hysteresis effect can be thereby adjusted to provide a dead band between a positive hysteresis level and a negative hysteresis level, wherein unwanted signals below the hysteresis levels do not affect the noise barrier output. That is, any signal which does not cross the hysteresis level opposite that hysteresis level last crossed to effect amplifier switching, will not be acted upon.

Where the circuit of FIG. 1 employs symmetry of resistance values in the bridge circuit, the hysteresis effect is balanced with respect to both polarities from the zero reference. The zero reference may be offset from the mid-point of the hysteresis band by the simple expedient of making the input resistors 12 and 13 unequal to a desired degree.

Figure 2:
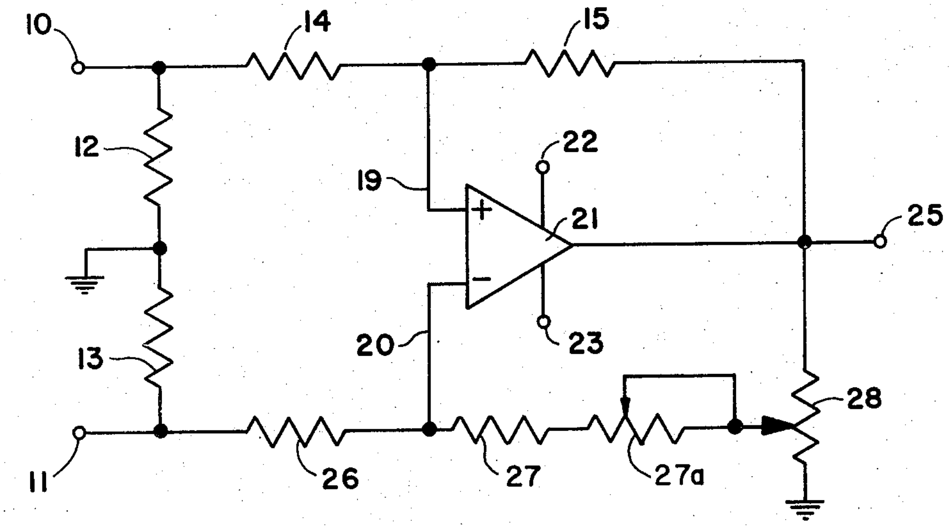
FIG. 2 is an embodiment of the invention having improved d-c stability.

The circuit of FIG. 2 functions in the same general manner as the circuit of FIG. 1, but has improved d-c stability resulting from a modified hysteresis adjustment, potentiometer 28. In this modified circuit, resistors 14, 15 and 26, 27 form the balanced bridge described functionally in conjunction with the circuit of FIG. 1. Rheostat 27*a* is employed to achieve exact resistive balance when the tap of potentiometer 28 is set to the output 25 end thereof, which is the simple open-loop amplifier condition of the noise barrier circuit. It may be noted that the balanced condition of the noise barrier circuit will result in the exhibition of maximum gain thereof. Potentiometer 28 is of a relatively low resistance compared with the bridge resistances 14, 15, 26, and 27. Adjustment of potentiometer 28 to increase the hysteresis effect of the noise barrier circuit does not appreciably change the resistive balance of the bridge, but instead functionally imbalances the bridge by reducing the feedback effect in the negative feedback path consisting of resistors 27 and 27*a*. By maintaining a resistive balance between the bridge resistors regardless of the hysteresis adjustment, the noise barrier circuit is given an improved d-c stability, and thus is suitable for applications having a wide range of temperatures, for example.

FIG. 3 shows the input of the noise barrier circuit modified by the removal of input resistors 12 and 13. This may be done when the two-wire input 10–11 is either not related to a common reference, or as shown, the common reference is connected to one of the input terminals 10 or 11, with a bipolar input signal 30 being connected to the other input terminal. This form of input may be used with either the noise barrier circuit of FIG. 1 or FIG. 2.

What is claimed is:

1. A noise barrier circuit having a pair of input terminals thereto and having an output terminal thereof and having a differential amplifier with a pair of differential inputs and having a first pair of resistances connected between said input terminals to said noise barrier circuit and respective differential inputs of said differential amplifier and having a second pair of resistive feedback paths connected from the output of said differential amplifier to respective said differential inputs of said differential amplifier and with said output of said differential amplifier forming said output of said noise barrier circuit, said resistances and said feedback paths forming a bridge configuration, means for balancing and unbalancing said bridge configuration, so that in a first condition of said noise barrier circuit said amplifier is in a balanced bridge configuration with said first pair of resistances and said second pair of resistive feedback paths whereby said noise barrier circuit acts as an open-loop amplifier with high gain and in a second condition said bridge configuration is unbalanced by a predetermined amount thereby introducing a bipolar hysteresis effect causing said noise barrier circuit to be switched only by bipolar input signals exceeding the levels determined by said hysteresis effect.

2. The noise barrier circuit of claim 1 with a pair of input common reference resistors connected from respective said input terminals to a circuit common reference.

3. The noise barrier circuit of claim 1 with one of said input terminals connected directly to a circuit common reference.

4. The noise barrier circuit of claim 1 with said means for balancing and unbalancing said bridge configuration consisting of a potentiometer adapted to obtain a desired degree of resistive imbalance in said bridge configuration.

5. The noise barrier circuit of claim 1 with said bridge being substantially in resistive balance under all conditions and with bridge operational imbalance for producing said hysteresis effect being obtained to a desired degree by said means for balancing and unbalancing said bridge configuration to vary the relative amounts of feedback as between said pair of feedback paths whereby a differential potential derived through said feedback paths is impressed between said differential inputs of said amplifier in the imbalanced condition of operation.

6. The noise barrier circuit of claim 5 with said amplifier being a stock integrated circuit.

* * * * *